MODIFIED HETERODYNE PHASE-LOCK FREQUENCY MULTIPLIER

Filed Sept. 14, 1964 2 Sheets-Sheet 1

INVENTOR.
FRANK D. McLIN
BY *Moody and Phillion*
ATTORNEYS

Oct. 4, 1966 F. D. McLIN 3,277,390

MODIFIED HETERODYNE PHASE-LOCK FREQUENCY MULTIPLIER

Filed Sept. 14, 1964 2 Sheets-Sheet 2

INVENTOR.
FRANK D. McLIN
BY
Moody and Phillion
ATTORNEYS

United States Patent Office 3,277,390
Patented Oct. 4, 1966

3,277,390

MODIFIED HETERODYNE PHASE-LOCK FREQUENCY MULTIPLIER

Frank D. McLin, Cedar Rapids, Iowa, assignor to Collins Radio Company, Cedar Rapids, Iowa, a corporation of Iowa Filed Sept. 14, 1964, Ser. No. 396,039
7 Claims. (Cl. 331—25)

This invention relates generally to a phase-locked frequency multiplier and more specifically to an improved phase-locked frequency multiplier which requires circuits with less critical tolerances than circuits employed in prior art phase-locked frequency multipliers.

In the prior art one of the simpler forms of phase-locked multipliers employs a pulse generator which generates a spectrum of frequencies feeding into a phase detector. The output of the phase detector its supplied to a variable controlled oscillator (VCO) through a filter. The output of the variable controlled oscillator which may be turned to a frequency NF, where F is a fundamental frequency of the pulse generator and N is an integer, is supplied back to the phase detector. Although the pulse generator puts out a spectrum of frequencies the phase detector will compare only the frequency FN fed back by the variable control oscillator and the corresponding harmonic FN of the pulse generator. The disadvantages of the aforementioned scheme are, firstly that the phase detector must be capable of handling the entire tuning range of a variable controlled oscillator and secondly, that the power input to the phase detector must be generated at the high output frequency where power gain is more difficult to obtain than at lower frequencies.

A prior art device which overcomes the disadvantages of the scheme mentioned above comprises a similar structure but with the addition of a mixer and a frequency multiplier not necessarily phase-locked with any other signal. The input signal is fed through the frequency multiplier to the mixer which also receives the output of the VCO. The output of the mixer is then fed to the phase detector. The frequency multiplier functions to produce a harmonic which is different from the output frequency of the VCO by a difference frequency F. Thus, if the output of the VCO were 10F, where F is the fundamental frequency of the input signal, then the output of the frequency multiplier would be 9F. The mixer responds to the frequencies of 9F and 10F to produce a difference frequency F which is supplied to the phase detector. Thus, there is generated a low intermediate frequency F for comparison in the phase detector. Consequently the phase detector is able to operate over the low frequency range only. Such a scheme, however, has a disadvantage in that its is necessary to provide a frequency multiplier from which various harmonics can be extracted without undue interference from adjacent harmonics. Thus, if the input signal is to vary from 25 megacycles to 45 megacycles, for example, the frequency multiplier must be capable of operating over 9 times 25 megacycles to 9 times 45 megacycles, assuming that the output frequency of the overall circuit is to be ten times that of the supplied input signal. Although the construction of a frequency multiplier capable of such a range is practical, it represents complication and expense which preferably could be eliminated.

An object of the present invention is to provide a phase-locked multiplier which does not exhibit the disadvantages of the prior art devices discussed above.

A further object of the invention is a phase-locked multiplier using a heterodyne scheme which does not require a frequency multiplier and a mixer for generating harmonics and for heterodyning as is necessary in the second of the prior art schemes discussed above.

A third object of the invention is a simplified and reliable phase-locked frequency multiplier operable over a substantial range of frequencies as compared with prior art devices.

A fourth purpose of the invention is to provide phase-locked frequency multiplier employing phase detector which is required to operate only over a frequency band much lower than the frequency output of the multiplier.

A fifth aim of the invention is the improvement of phase-locked frequency multipliers generally.

In accordance with the invention there is provided a phase shift circuit which is responsive to a pulse generator having a fundamental frequency F to produce two outputs of frequency F which are phase shifted apart by an angle $\alpha$, where $\alpha$ is usually 90°. One of the outputs of the phase shift circuit is supplied to a phase detector, and the other is supplied to a spectrum generator which responds thereto to produce a spectrum of odd harmonics which are then supplied to a mixer. Also supplied to the mixer is the output from a VCO. For purposes of general discussion assume it is described to generate the tenth harmonic (10F) in the VCO. Under this condition the important harmonics of the spectrum generator are the ninth and eleventh having frequencies 9F and 11F respectively. These ninth and eleventh harmonics are included in the spectrum supplied to the mixer from the spectrum generator. The output of the mixer consequently consists of two beat frequency signals of equal frequency F but of opposite phase. Such two output signals tend to cancel each other at the output of the mixer, i.e. in the absence of any phase shift circuit.

However, the cancellation of the two beat frequency output signals of the mixer is avoided by the inclusion of the phase shift circuit and making $\alpha=90°$. Under such circumstances, as will be shown in detail in the specification, the phases of the two interfering signals, that is, the phases of the ninth and eleventh harmonics of the output of the spectrum generator, are shifted so that they reinforce rather than cancel.

The aforementioned and other objects and features of the invention will be more fully understood from the following detailed description thereof when read in conjunction with the drawings in which.

The prior art structures of FIG. 1 and FIG. 2 will be described first, briefly, to provide the reader with the necessary background to more easily understand the invention.

Figure 1:
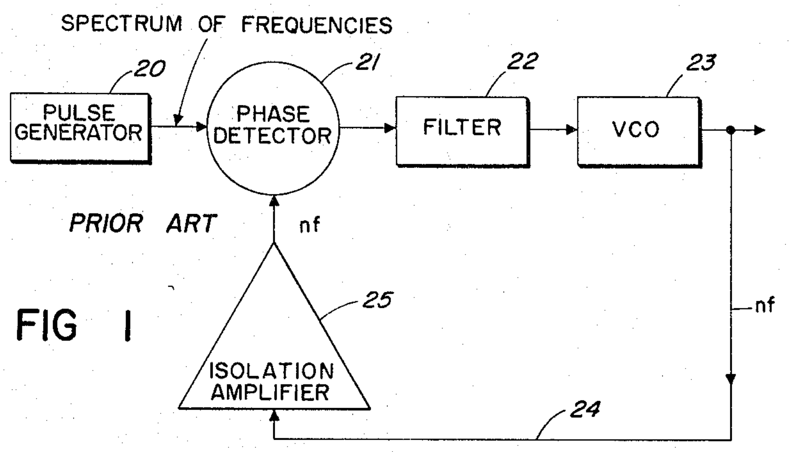
FIGS. 1 and 2 are diagrams of prior art structures.

In the prior art structure of FIG. 1, for example, assume that a reference frequency F generated by pulse generator 20 is variable over the range of approximately 25 to 50 megacycles. It is desired to multiply this reference frequency by a factor of 10 to obtain a coherent output signal at the output of the variable control oscillator 23, which output signal is variable over the range of frequencies extending from 250 megacycles to 500 megacycles, and which is relatively free of other harmonics of the fundamental frequency. "Relatively free of other harmonics" in this case means generally that other harmonics must be approximately 60 to 70 decibels or more below the desired tenth harmonic. In FIG. 1, which is commonly known as a phase-locked frequency multiplier, the phase detector 21 is employed to compare the output signal of VCO 23 with a reference signal from generator 20, which reference signal contains harmonics at the desired VCO signal. It is assumed that the desired multiplication factor is 10 so that the output of VCO 23 must be ten times the fundamental frequency of the signal supplied to the phase detector from pulse generator 20. A filter 22 functions to pass only the desired frequency 10F to the VCO. To complete the loop and provide phase-lock, output of the VCO is fed back to phase detector 21 through isolation amplifier 25 which provides the necessary amplification for the fed-back signal.

The important disadvantages of the scheme shown in FIG. 1 are as follows. Firstly the phase detector 21 must be capable of handling the entire tuning range, and secondly the power input to the phase detector 21 must be generated at the high output frequency where power gain is difficult to obtain.

Figure 2:
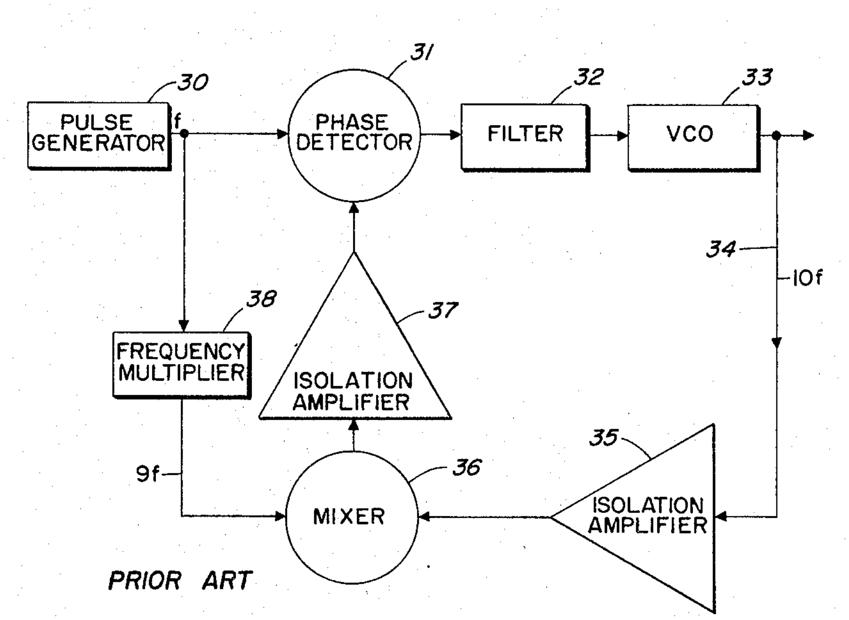

In FIG. 2 there is shown another prior art multiplier using a heterodyne principle. In the structure of FIG. 2, the output signal of VCO 33 is passed through an isolation amplifier 35 and mixed with the output of frequency multiplier 38 in mixer 36. The output of the mixer 36 is supplied through another isolation amplifier 37 to phase detector 31 where it is compared with the input from the pulse generator 30. Assuming again that the frequency of the output of the pulse generator 30 has a fundamental frequency F, it is desired that the output of the VCO 33 be ten times F as indicated in FIG. 2. Under these circumstances the output of the frequency multiplier 38 is caused to be the ninth harmonic of the fundamental of pulse generator 30. Thus when the ninth and tenth harmonics are mixed in mixer 36 the resultant signal has a frequency F which is passed through isolation amplifier 37 to phase detector 31. Thus there is supplied to the phase detector 31 two signals, each of frequency F. The output of the phase detector 31 is supplied through filter 32, which removes the A.-C. components therefrom, and supplies the remaining D.-C. control voltage to VCO 33 to control the phase thereof in a conventional manner.

It will be observed that the tenth and the ninth harmonics, in the example of FIG. 2, are merely typical values. If it were desired to produce a 20th harmonic at the output of the VCO 33 then the selected harmonic of frequency multipler 38 would be the 19th harmonic; the difference between the 19th and 20th harmonic being a signal of frequency F.

In the arrangement of FIG. 2 power gain is required to drive the phase detector over only the low frequency range of 25 to 50 megacycles plus the required capture range on either side. This scheme, however, has a disadvantage in that in order to generate the mixer injection it is necessary to provide the multiplier 38 from which the necessary harmonic can be extracted, while suppressing other harmonics which might be generated in the circuit. More specifically, the frequency multiplier 38 must be equivalent, at the minimum, to a tuned circuit which is adjustable over the range of nine times 25 megacycles to nine times 50 megacycles, assuming that the multiplication factor of the output signal from VCO 33 is ten.

Figure 3:
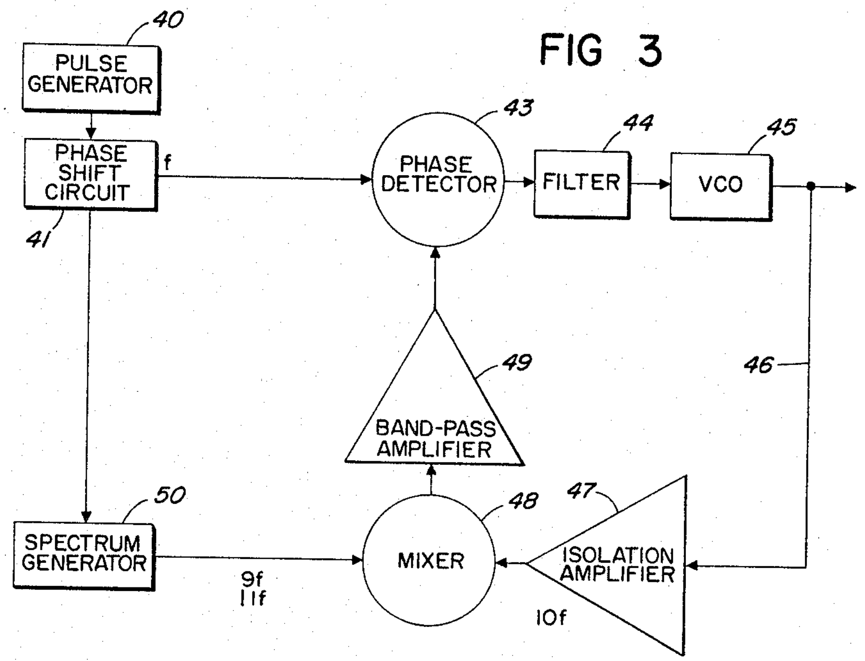
FIG. 3 is a block diagram of the invention.

Referring now to the circuit of FIG. 3 there is shown a block diagram of the invention. The circuit of FIG. 3 is somewhat similar to that of FIG. 2, except that the circuit of FIG. 3 does not require the adjustable tuned circuit such as circuit 38 of FIG. 2 to select a harmonic, such as the ninth harmonic. In FIG. 3 the spectrum generator supplies a constant spectrum to mixer 48 to generate the desired intermediate frequency. Such spectrum contains all the odd harmonics of the input frequency. Thus, in the case where it is desired to obtain the multiplication factor of 10 at the output of VCO 45 the spectrum generator 50 will contain the ninth and eleventh harmonics of the fundamental frequency F, which is the output signal of the pulse generator 40. Also supplied to mixer 48 is the output of the VCO 45 through isolation amplifier 47, which output has a frequency 10F. Since both the ninth harmonic, eleventh harmonic and the tenth harmonic (10F) supplied to the mixer 48 are derived originally from the fundamental component of the pulse generator 40, the output of the mixer 48 would, in the absence of phase shift means 41, consist of two signals of equal frequency F, but of opposite phase, and would cancel each other. The mathematical analysis set forth later herein will clearly point out why such cancellation ordinarily would take place.

However, such cancellation can be eliminated by the addition of phase shift circuit 41 which functions to produce a phase shift between the signals supplied to the phase detector 43 and the spectrum generator 50. Such phase difference is designated generally by $\alpha$ and, as will be seen from the analysis set forth hereinafter, should be 90°. When such phase shift $\alpha$ is made equal to 90°, the two signals produced at the output of mixer 48 of frequency F will reinforce each other rather than cancel each other. It will be observed that with the circuit of FIG. 3 no tuned multiplier is required. The only adjustment necessary is that the VCO 45 be set to the nearest correct harmonic in order to be in the pull-in range of the circuit. Other advantages of the circuit of FIG. 3 are that the power gain is that required over the fundamental frequency range of 25 to 50 megacycles, which is the output frequency range of pulse generator 40, rather than over the higher frequency bandwidth of 250 to 500 megacycles, which is the output of the VCO 45. Similarly, the phase detector 43 is required to operate only over the range of 25 to 50 megacycles rather than over the higher range of 250 to 500 megacycles.

Figure 4:
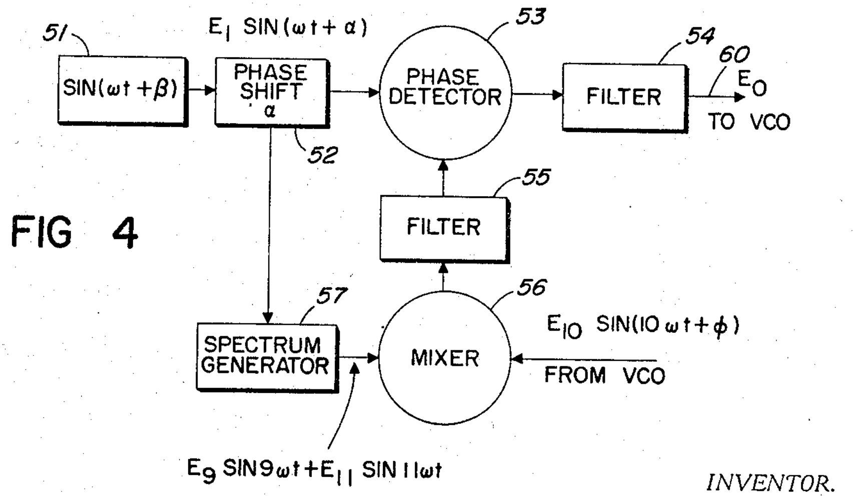
FIG. 4 is a block diagram of a modification of the invention from which a mathematical proof of the invention is more easily derived as will be shown in the specification.

In order to provide a mathematical proof of the circuit of FIG. 3, the somewhat simplified block diagram is shown in FIG. 4. In the following analysis it is assumed that the mixer 56 of FIG. 4 and the phase detector 53 are circuits which have an output equal to the product of the two inputs. In actual practice there are other higher order terms present but their contribution does not alter the results to any appreciable extent. It is desired that the output $E_0$ appearing on output lead 60 be a function of $\phi$, which is the phase angle on the signal at $10\omega$ radians per second, supplied from the VCO (not shown) to the input of mixer 56. The filters 55 and 54 are employed only to remove unwanted R-F components from the respective signals. The phase angle on the input signal appearing at source 51 is of no consequence whatsoever. Further, such phase angle may vary over the entire operating frequency range. The important phase angle is the phase angle $\alpha$ which is the phase angle between the two signals appearing on the two output terminals of the phase shift circuit 52. Such phase angle $\alpha$ must be held reasonably constant over the operating frequency range of from 25 to 50 megacycles in the particular example being used in this specification.

Following is a mathematical analysis of the circuit of FIG. 4.

$$A=E_{10}\sin(10\omega t+\phi)[E_9\sin 9\omega t+E_{11}\sin 11\omega t]$$
$$+\tfrac{1}{2}E_9E_{10}[\cos(10\omega t+\phi-9\omega t)-\cos(10\omega t+\phi+9\omega t)]$$
$$+\frac{E_{10}E_{11}}{2}[\cos(10\omega t+\phi-11\omega t)-\cos(10\omega t+\phi+11\omega t)]$$

Where A represents the composite output signal at the output of mixer 56. Filter 55 then removes the terms at 19$\omega$ and 21$\omega$, so:

$$A_0=\tfrac{1}{2}[E_9E_{10}\cos(\omega t+\phi)+E_{10}E_{11}\cos(\phi-\omega t)]$$

Where $A_0$ is the composite output signal appearing at the output of filter 55. This signal $A_0$ is then multiplied in the phase detector, so:

$$D_0=A_0E_1\sin(\omega t+\alpha)$$

Where $D_0$ is the composite output signal of phase detector 53. Then, assuming a flat spectrum, let $E_{11}=E_9$;

So $$E_9E_{10}=E_{11}E_{10}=2E$$

Then $$A_0=E[\cos(\omega t+\phi)+\cos(\phi-\omega t)]$$

And $$D_0=EE_1 \sin(\omega t+\alpha)[\cos(\omega t+\phi)+\cos(\phi-\omega t)]$$

Expanding $$D_0\frac{EE_1}{2}[\sin(\omega t+\alpha+\omega t+\phi)+\sin(\omega t+\alpha-\phi-\omega t)+\sin(\omega t+\alpha+\phi-\omega t)+\sin(\omega t+\alpha-\phi+\omega t)]$$

Filter 54 removes the terms at $2\omega$.

Then $$E_0=\frac{EE_1}{2}[\sin(\alpha-\phi)+\sin(\alpha+\phi)]$$

$$=\frac{EE_1}{2}(2)\sin\frac{\alpha-\phi+\alpha+\phi}{2}\cos\frac{\alpha-\phi-\alpha-\phi}{2}$$

$$=EE_1 \sin\alpha \cos\phi$$

Now, in this system $\alpha$ is constant at 90°.

Therefore: $E_0=EE_1 \cos\phi$—which is the desired output.

It is to be noted that the term "sin $\alpha$" becomes unity only when $\alpha$=90°. While the description of the invention has been made with the assumption that $\alpha$=90°, it is to be understood that substantially satisfactory performance can be obtained when $\alpha$ is different from 90°. For example, if $\alpha$ were equal to 45°, the sin of $\alpha$ would be .707 so that slightly over 70 percent of the maximum possible output could be obtained. Similarly, if $\alpha$ were equal to 30° the sum thereof would be 0.5 so that 50 percent of the maximum output would still be obtained. Corresponding phase relationship in the other three quadrants, as for example, where $\alpha$=150°, 210°, or 330°, would all result in a value of sin $\alpha$=0.5, although the 0.5 would be negative in the cases of where $\alpha$=210° or 330°.

As $\alpha$ approaches 0° to 180°, the sine of $\alpha$ approaches 0 quite rapidly and the advantage of the present invention disappears. Although the limits are somewhat arbitrary, the scope of the present invention is intended to include all values of $\alpha$ lying between 90°±60° and 270°±60°.

It is to be noted that the form of the invention shown and described herein is but a preferred embodiment thereof and that various changes may be made in the circuit design without departing from the spirit or the scope of the invention.

I claim:

1. A phase-locked frequency multiplier comprising:
means for producing first and second signals of frequency F and separated in phase by an angle $\alpha$, where $\alpha$ is any angle lying within the ranges of $N90°\pm60°$, where N is an odd integer;
spectrum generator means responsive to said first signal to produce a spectrum of harmonics of said frequency F;
feedback loop means comprising variable controlled oscillator means, mixer means, first filter means, and circuit means including phase detector means, all arranged in cascade;
said mixer means responsive to the output signal of said variable controlled oscillator and said spectrum generator to produce a spectrum of beat frequency signals;
said circuit means responsive to said second signal and the beat frequency output signals of said mixer means having a frequency at or near F, to produce a second output signal for controlling the phase of the output signal of said variable controlled oscillator means.

2. A phase-locked frequency multiplier in accordance with claim 1 in which:
said circuit means further comprises second filter means responsive to the spectrum of beat frequency signals from said mixer means to pass only those beat frequency signals having a frequency at or near F;
and in which said phase detector means is responsive to the output signal of said second filter means and said second signal.

3. A phase-locked frequency in accordance with claim 2 in which said spectrum generator means is constructed to respond to said first signal to produce a spectrum consisting only of odd harmonics of the frequency F.

4. A phase-locked frequency amplifier means in accordance with claim 3 in which said variable controlled oscillator comprises means for tuning close to the output frequency desired.

5. A phase-locked frequency multiplier comprising:
generating means for supplying an input signal of frequency F; phase shift means responsive to said input signal to produce second and third signals of frequency F and separated by a phase angle $\alpha$, where $\alpha$ is any angle lying within the rangs of $N90°\pm60°$, where N is an odd integer;
spectrum generating means responsive to said second signal to produce a spectrum of harmonics of the frequency F;
a feedback loop comprising:
mixer means,
phase detector means,
first filter means,
and variable control oscillator means;
said mixer means responsive to the output signal of said variable control oscillator means, whose output signal has a frequency NF where N is an even integer, and to the output signal of said spectrum generator to produce a spectrum of beat frequencies;
said first filter means responsive to the output signal of said mixer means to pass only the beat frequency signals of frequency F;
said phase detector means responsive to the output signal of said first filter means and the said third signal from said phase shift circuit to produce a signal indicative of the phase angle therebetween,
and said variable controlled oscillator responsive to the output signal of said phase detector means to control the phase of the variable controlled oscillator's output signal.

6. A phase-locked frequency multiplier in accordance with claim 5 in which said spectrum generator means is constructed to respond to said second signal to produce a spectrum consisting of odd harmonics of the frequency F.

7. A phase-locked frequency multiplier in accordance with claim 6 in which said variable controlled oscillator means comprises means for tuning close to the frequency desired.

References Cited by the Examiner

UNITED STATES PATENTS 3,136,956 6/1964 Slonczewski ........ 331—25 X

ROY LAKE, *Primary Examiner.*

J. B. MULLINS, *Assistant Examiner.*